United States Patent
Blyth et al.

(10) Patent No.: US 6,510,081 B2
(45) Date of Patent: *Jan. 21, 2003

(54) ELECTRICALLY-ERASEABLE PROGRAMMABLE READ-ONLY MEMORY HAVING REDUCED-PAGE-SIZE PROGRAM AND ERASE

(75) Inventors: Trevor Blyth, Sandy, UT (US); David Sowards, Fremont, CA (US); Philip C. Barnett, Oxon (GB)

(73) Assignee: Advanced Technology Materials, Inc., Danbury, CT (US)

(*) Notice: Subject to any disclaimer, the term of this patent is extended or adjusted under 35 U.S.C. 154(b) by 0 days.

This patent is subject to a terminal disclaimer.

(21) Appl. No.: 10/022,314

(22) Filed: Dec. 18, 2001

(65) Prior Publication Data

US 2002/0114185 A1 Aug. 22, 2002

Related U.S. Application Data

(63) Continuation of application No. 09/564,324, filed on May 3, 2000, now Pat. No. 6,400,603.

(51) Int. Cl.$^7$ ............................................. G11C 16/04
(52) U.S. Cl. .............................. 365/185.12; 365/185.11; 365/185.18
(58) Field of Search ....................... 365/185.12, 185.11, 365/185.18, 185.33

(56) References Cited

U.S. PATENT DOCUMENTS

| | | | |
|---|---|---|---|
| 5,339,279 A | 8/1994 | Toms et al. | |
| 5,365,484 A | 11/1994 | Cleveland et al. | |
| 5,646,890 A | 7/1997 | Lee et al. | |
| 5,682,350 A | 10/1997 | Lee et al. | |
| 5,687,121 A | 11/1997 | Lee et al. | |
| 5,765,185 A | 6/1998 | Lambrache et al. | |
| 5,852,577 A | 12/1998 | Kianian et al. | |
| 5,890,192 A | 3/1999 | Lee et al. | |
| 5,943,266 A | 8/1999 | Ogura et al. | |
| 5,986,933 A | * 11/1999 | Takeuchi et al. | 365/185.12 |
| 6,122,193 A | * 9/2000 | Shibata et al. | 365/185.03 |

* cited by examiner

*Primary Examiner*—Huan Hoang
(74) *Attorney, Agent, or Firm*—Oliver A. Zitzmann; Margaret Chappuis

(57) ABSTRACT

By reducing the size of the blocks or pages that are contained in a FLASH EEPROM array that must be erased in a write or erase operation, the size of register needed is reduced, making it easier for the processor to handle smaller blocks of information, reducing the size and complexity of the microprocessor, and increasing the endurance of the FLASH EEPROM allowing it to be used in place of the state of the art EEPROM. Replacing mask ROM by flash EEPROM allows full testing of the code storage area as well as allowing customers to use that space for testing in their manufacturing procedures. The code used for testing can then be cleared and reprogrammed with the final code storage before final shipment.

31 Claims, 9 Drawing Sheets

ELECTRICALLY-ERASEABLE PROGRAMMABLE READ-ONLY MEMORY HAVING REDUCED-PAGE-SIZE PROGRAM AND ERASE

This is a continuation of U.S. application Ser. No. 09/564,324, filed May 3, 2000, now U.S. Pat. No. 6,400,603.

BACKGROUND OF THE INVENTION

1. Field of the Invention

The present invention relates to an array of FLASH electrically eraseable programmable read-only memory ("FLASH EEPROM") cells having reduced-page-size erasing and programming. More particularly, the present invention relates to the use of this reduced-page-size FLASH EEPROM in place of state of the art EEPROM in embedded microprocessors for smart card applications.

2. Description of the Related Art

Traditional microprocessor smart card integrated circuits ("ICs") have used masked ROM and EEPROM for code and data storage respectively. The use of masked ROM for code storage has significant cost and time-to-market disadvantages associated with software changes, especially since smart cards can be extremely software intensive. Specifically, one such disadvantage is the long development time and inherent inflexibility of masked ROM that results in a large undertaking to turn a design and its software into new ICs.

Because traditional EEPROM technology can occupy six times the die area to implement the same memory size as masked ROM, the cost associated with such an increase in die size has prohibited replacing masked ROM with these EEPROM technologies. Additionally, with the ever-increasing die sizes the large size of the EEPROM cells has increased the cost of the silicon.

While FLASH EEPROM technology is considered a viable replacement for EEPROM technology in many applications, its function is not identical to that of EEPROM technology. Unlike an EEPROM which can erase or program byte by byte, a FLASH EEPROM erases or programs large multiple byte size blocks. Specifically, in a FLASH EEPROM a write (i.e. program) of a portion of data that is smaller than the block size starts with a read out of a block of cells into a register. The desired program change is made to the individual cells in the register. Then the block in the FLASH EEPROM array is erased and the reprogrammed register contents are written back into the block.

Several problems occur with this erase and program process in the FLASH EEPROM. First, to erase or program a block of memory in the FLASH EEPROM a register the size of the block is needed. The larger the erasable block the larger the register and the more space on the chip it takes. Secondly, the larger the block size the more data that the microprocessor must handle. This means a larger and more complex microprocessor or much more processing time. Smaller pieces of data are easier for the microprocessor to handle. Thirdly, the FLASH EEPROM endurance is reduced. In many applications, including smart cards, the number of bytes of new data to be written at any one time is small. Since the erase block is relatively large, many bytes in the same block do not need to change data but are nevertheless erased because all bytes contained in the same erase block must be erased simultaneously. Such bytes are first read then erased and re-written with the same data as was held previously. Thus, many bytes experience unnecessary erase and programming cycles that would not otherwise be required, if the erase block was small. The number of times that a single bit can be erased and programmed and still maintain its ability to store data without errors is finite and is referred to as endurance. The unnecessary erase program cycles subtract from the total number of endurance cycles, thus reducing the number of cycles available for useful data changes. It is thus an objective of this invention to have a FLASH EEPROM memory for the microcontroller in a smart card that has reduced size blocks (i.e. page) for erasing or programming.

SUMMARY OF THE INVENTION

The present invention relates the use of FLASH EEPROM technology for both code and data storage on embedded microprocessors for smart card applications. By using FLASH EEPROM technology to replace most of the traditional mask ROM for code storage, the present invention combines the low cost advantages of mask ROM and the re-programmability of traditional EEPROM technology. This enables the user to change and adapt the program code without going through a costly and time-consuming ROM mask change procedure. At the same time, by using the same FLASH EEPROM technology for data storage in place of state of the art EEPROM technology the present invention provides a significant savings in die area and other cost and performance benefits to the user.

More particularly, the present invention relates to reducing the size of the blocks or pages that are contained in a FLASH EEPROM array that must be erased in a write or erase operation. This reduces the size of register needed, makes it easier for the processor to handle smaller blocks of information, reduces the size and complexity of the microprocessor, and increases the endurance of the FLASH EEPROM and allows it to be used in place of the state of the art EEPROM.

Additionally, the replacement of mask ROM by flash EEPROM allows full testing of the code storage area as well as allowing customers to use that space for testing in their manufacturing procedures. The code used for testing can then be cleared and reprogrammed with the final code storage before final shipment.

DETAILED DESCRIPTION OF THE INVENTION

Figure 1:
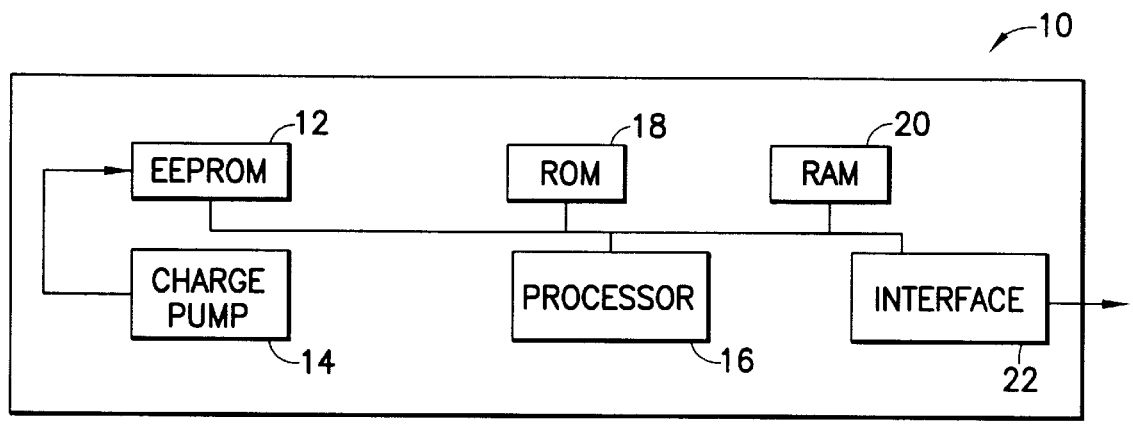
FIG. 1 is a block diagram of a prior art smart card.

FIG. 1 shows a prior art single chip smart card 10 having an EEPROM memory 12. The EEPROM has an internal charge pump power supply 14 which provides a high voltage from 12–15 v for erasing from and writing to the EEPROM. The remainder of the circuitry on the smart card IC includes a processor 16, for example an 8051 microprocessor, ROM (read only memory) 18, RAM (Random Access Memory) 20, and an interface 22 for interfacing the circuitry of the smart card 10 to external power and data input sources. The external power source is 3.0 volts which is the supply voltage used to operate the smart card 10. The EEPROM needs only 3 v. for its read voltage. However, a write (i.e. programming) or erase operation, needs a charge pump 14 to generate 12 or 15 v., respectively.

The different memories are optimized for their specific purpose—the ROM to hold the executable code, EEPROM to hold data that changes but must be retained when the power is removed, and RAM that is used as a scratchpad. This invention replaces the large amount of ROM that is traditionally part of the semiconductor Fabrication process and specific to every Application usage, with a small amount of ROM that is specific to the chip and an OTPROM (One Time Programmable Read Only Memory) that can be programmed with the final code by the user. This OTPROM can be erased and programmed by the user many times and then locked to stop changing of the program, in the field. The ROM contains the chip specific software that allows testing and provides the primitive routines to allow a generic software interface, to work with any family member, similar to the BIOS found in a Personal Computer. Both the EEPROM and the OTPROM in this invention use the same non-volatile cell with the peripheral circuitry designed to give the desired function.

Figure 2:
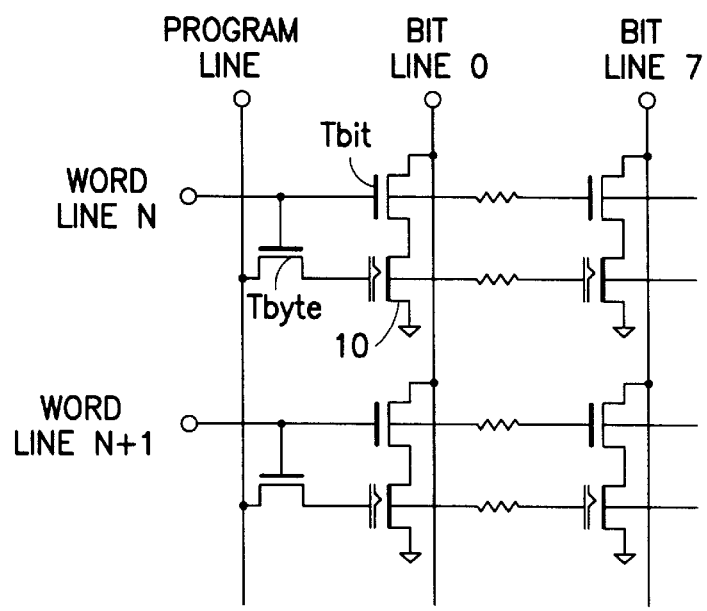
FIG. 2 is a schematic of part of a prior art EEPROM.

A schematic of two bytes of a prior art EEPROM cell is shown in FIG. 2. EEPROM technology is based on a memory transistor which consists of a source, channel, and drain with a floating gate over the channel and a control gate isolated from the floating gate. The act of programming the cell involves charging the floating gate with electrons, which causes the turn-on threshold of the memory cell to increase. Thus, when programmed, the cell will not turn on; that is, it will remain non-conductive, when addressed with a read potential applied to its control gate. The act of erasing the cell involves removing electrons from the floating gate to lower the threshold. With the lower threshold, the cell will turn on to a conductive state when addressed with a read potential to the control gate.

In FIG. 2, one cell needs 2 transistors, one of which, Tc, has a tunneling window and an additional transistor, Tbyte, that is shared between 8 cells, thus making the cell size large. The cell includes a cell transistor Tc, a bit select transistor Tbit, and shares a byte select transistor Tbyte with seven other cells. Table 1 is an operation table showing how the EEPROM of FIG. 2 can program and erase in groups of 8 cells (1 byte).

TABLE 1

|  | PROGRAM | ERASE | READ |
| --- | --- | --- | --- |
| SELECTED WORD LINE | 20 V | 20 V | 5 V |
| UNSELECTED WORDLINE | 0 V | 0 V | 0 V |
| PROGRAM LINE | 17 V | 0 V | 0 V–2 V |
| BIT LINE 0 (ERASED) | 0 V | 17 V | 1.6 V |
| BITLINE 7 (PROGRAMMED) | 0 V | 0 V | 2.0 V |

Figure 3:
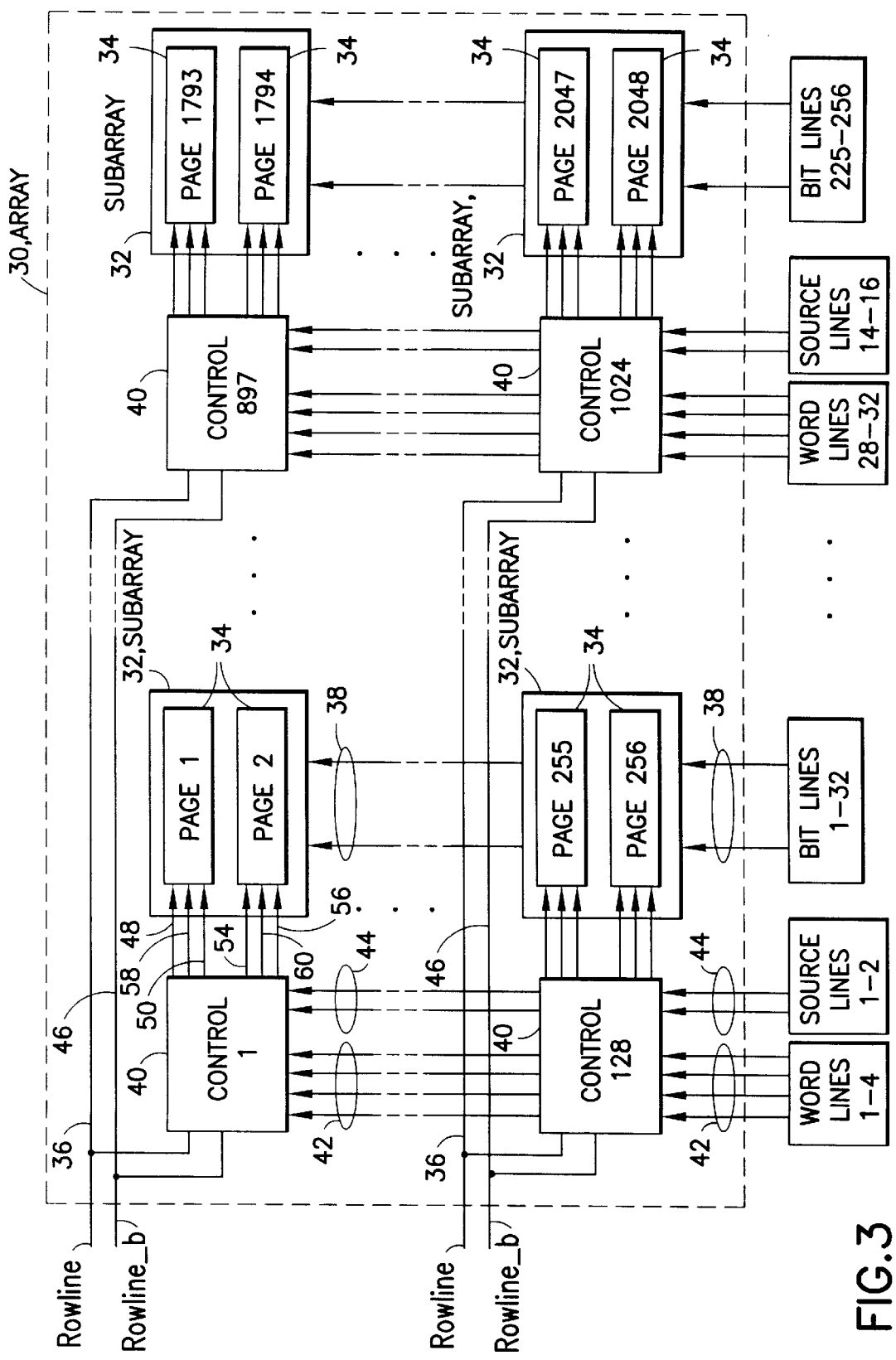
FIG. 3 is a block diagram of the FLASH EPROM array of the invention.

FIG. 3 is a block diagram of the inventive array 30 having reduced-page-size erasing and programming. FIG. 3 illustrates one embodiment of the present invention, where a small page size of only 8 bytes can be altered using this technology. The result is dramatic. It allows the direct replacement of EEPROM. The small page size of 8 bytes, instead of 64 or 128, allows the cycling to be increased almost an order of magnitude. For these array sizes, it is expected to equal or exceed the standard for most EEPROM technology. Data retention for this technology is expected to equal or exceed the standard.

The array 30 is organized in 8 columns of 256 pages 34 of 8 bytes with 8 bits in each byte. There are 8 corresponding control-circuit-columns of 128 control circuits 40 with one control circuit 40 corresponding to two pages 34. There are 128 control-circuit-row lines 36 and 8 sets of 32 bit lines 38. Control-circuit-row lines 36 connect into control circuits 40 with one control-circuit-row line 36, and one rowline_b 46 per row of control circuits 40. The control-circuit-row lines 36 and rowline_b lines 46 extend to all control circuits 40 in a row. There is a set of four word lines 42 and a set of 2 source lines 44 for each column of control circuits 40. For example word lines 1–4 and source lines 1–2 connect to control circuits 1–128 and word lines 28–32 and source lines 14–16 connect to each of the control circuits 897–1024. 256 pages in the vertical direction and 8 pages in the horizontal direction make up 2048 pages in the array 30.

These word lines and source lines are selectively coupled by the control circuits 40 to connect to the page-word line inputs and page-source line inputs for the cells in pages 34. In control circuit 1 page-word line 1 (48), page-word line 2 (50) and page-source line 1 (58) are switched to two rows of cells respectively in page 1. Page-word line 3 (54), page-word line 4 (56) and page-source line 2 (60) are switched to another two rows of cells in page 2. Similarly, the four word lines 28–32 and two source lines 14–16 are selectively coupled to the pages 34 corresponding to the control circuits 40 in the last column that is comprised of pages 1793–2048.

Bit lines 1–32 are connected to the bit line inputs of the cells in all pages between pages 1 and page 256. The remaining 7 sets of 32 bit lines are similarly connected to the bit line inputs of the cells in the rest of the pages in array 30. Bit lines 225–256 connect to the bit line inputs of the cells in the pages of the last column of pages 34.

The page-word lines are connected to the gates of the cells, the bit lines are connected to drains and the page-source lines to the source inputs.

It is understood that the designation of rows and columns (and rowlines and bitlines) is for definitional purposes only and they could be interchanged (rows for columns and columns for rows) and still be operationally the same. The cells may be made using the SST SuperFlash Technology of Silicon Storage Technology Inc. or other suitable Flash EPROM technonogy. The SST SuperFlash Technology is described subsequently beginning with FIG. 5.

In a write operation the first step is to read out the desired page into a register. The register is external to the array (30) and, in the interests of clarity, is not shown in FIG. 3. The byte information that is to be written to the page is changed in the register using known techniques. The page is then erased in the manner described below. The contents of the register are then written back into the page from the register. The writing is done to the cells of each page on a byte by byte basis. A control-circuit-row line, page-word line, page-source line and bit line all must be selected for a write to occur. For example, to write in the first cell of page 1, control-circuit-row line 1, page-word line 1, page-source line 1, and bit line 1 must be selected. A select voltage of about 14V, applied to control-circuit-row line 1, is sufficiently high to pass voltages on the word line and source line on to the page-word line and page-source line without any voltage drop. A voltage approximately equal to a threshold voltage, Vt, is applied to word line 1 and consequently applied to the page-word line input of all cells on the first row of page 1. A voltage of about 12V is applied to source line 1 and, due to the high voltage on control-circuit-row line 1, is applied also to the page-source line input of all cells in page 1. A cell is programmed if a drain current is allowed to flow but remains erased if drain current does not flow through the cell. A low voltage, close to 0V is applied to bit line 1 to program the cell (to logic 0) and a high voltage, close to 3V, is applied to bitline1 to inhibit programming and leave the cell in the erased or conducting state (logic 1). Pages which are not to be written are unselected by either applying 0V to the corresponding word lines and source line or by applying 0V to the corresponding control-circuit-row line. The writing could be done on a cell by cell or a multiple byte basis by selecting 8 bit lines or multiples of 8 bit lines simultaneously in a known manner.

Read outs may occur bit by bit or byte by byte or other ways that are known in the art. In the example, reading is done byte by byte. To read, the page-source line voltage is at 0V, the selected bit lines for the byte to be read are at about 1.2V, and the page-word line voltage is at about 2V.

Figure 4A:
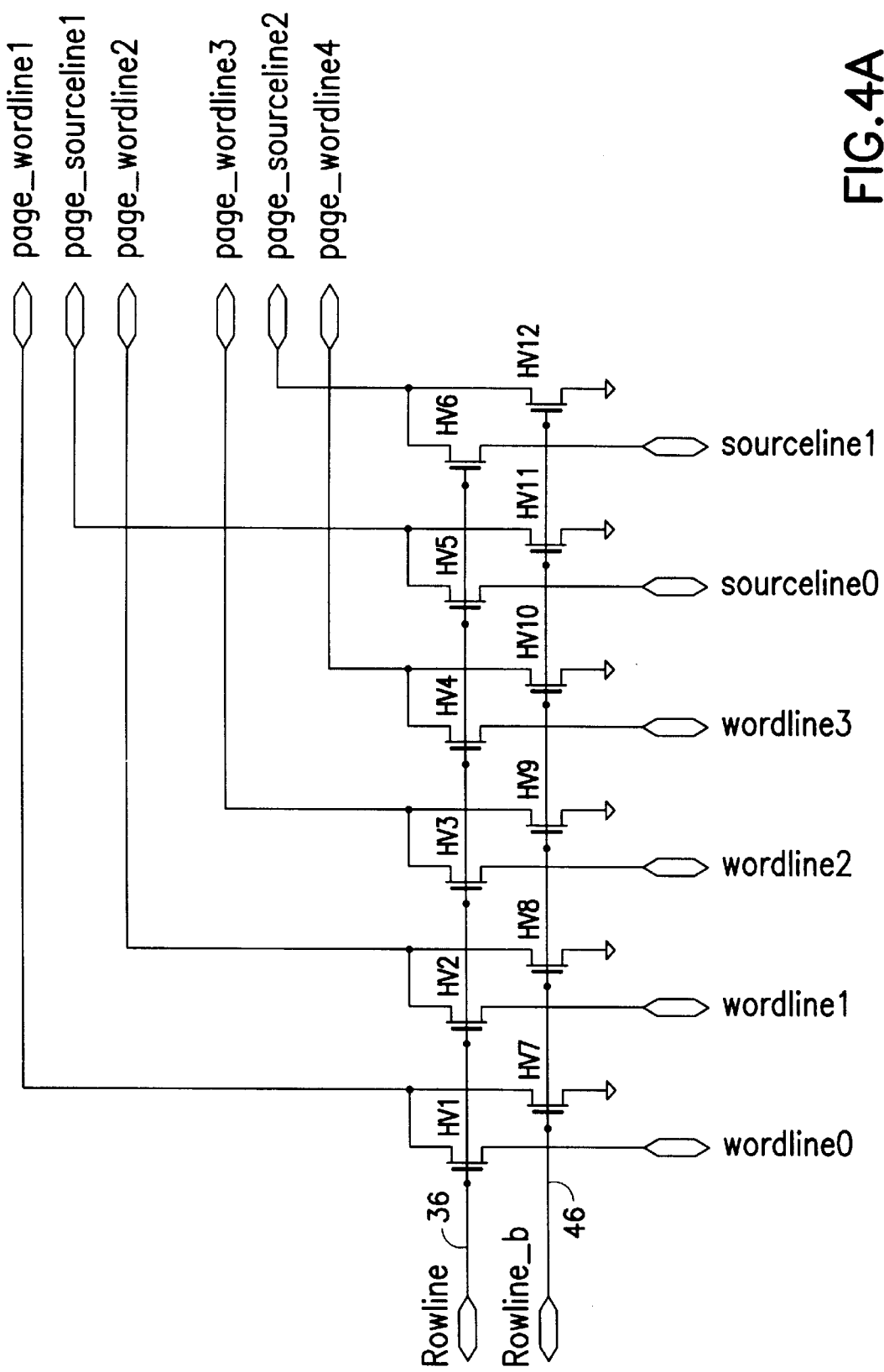
FIG. 4A shows a schematic diagram of the control (40) of FIG. 3.

FIG. 4A is a detailed schematic of one embodiment of control circuit 40. Control-circuit-row line (36) connects to the gates of HV1–HV6 and, when taken to the select voltage, couples word lines (42) and source lines (44) on to the corresponding page-word lines and page-source lines in the selected page. The select voltage applied to the control-circuit-row line (36) is of a higher value than the voltage applied to either the word lines (42) or the source lines (44) so as to avoid threshold voltage drops across the channels of HV1–HV6. Thus, during erase when selected word lines (42) are at about 15V, the selected control-circuit-row line (36) is at about 17V. Similarly the respective voltages on selected source lines (44) and selected word lines (42) are about 14V and 12V during programming and about 3V and 1.2V during read. In this manner the word line and source line signals are coupled into the memory cell transistors without loss of voltage.

The rowline b 46 signal that connects into all controls 40 is a logic level signal (i.e. equal to either Vdd or Vss) and is the logical inverse of rowline 36. In other words, when control-circuit-row line 36 is at 0V, rowline__b 46 is at Vdd, and when control-circuit-row line 36 is appreciably above 0V, rowline__b is at Vss. When control-circuit-row line 36 is high, HV1–HV6 have a high potential on their gate inputs and therefore all page-word lines and page-source lines are at a voltage that is determined by word lines (42) and source lines (44). Since the latter signals are at 0V when unselected, it follows that all unselected page-word lines and all unselected page-source lines within a selected control-circuit row of pages 34 are at 0V. All other control-circuit rows of pages 34 are unselected and have 0V on the control-circuit row lines 36 and Vdd on the rowline__b signals. The unselected pages 34 have Vdd applied to the gates of HV7–HV12 and therefore all such unselected page-word lines and unselected page-source lines are at 0V. It can be seen that all nodes within the array 30 are at a well-defined voltage at all times. Inputs and outputs to every cell are at a known voltage and do not enter a static condition whereby they can float or be in a high impedance state. This is especially important with recent flash memory technologies, including SST Super-Flash EEPROMs, since the electron transport mechanisms to and from the floating gate are very efficient. Even small undesirable currents and voltages created by parasitic effects such as capacitive coupling and leakage can create unwanted erase or programming. While small, the accumulative effects of these undesirable effects can be significant. In addition, during read, it is important to minimize the "off"current of each cell, especially at large memory densities in which a large number of cells are connected directly to the bit lines. Thus, during read it is also important to ensure that all unselected page-word lines are at 0V.

Figure 4B:
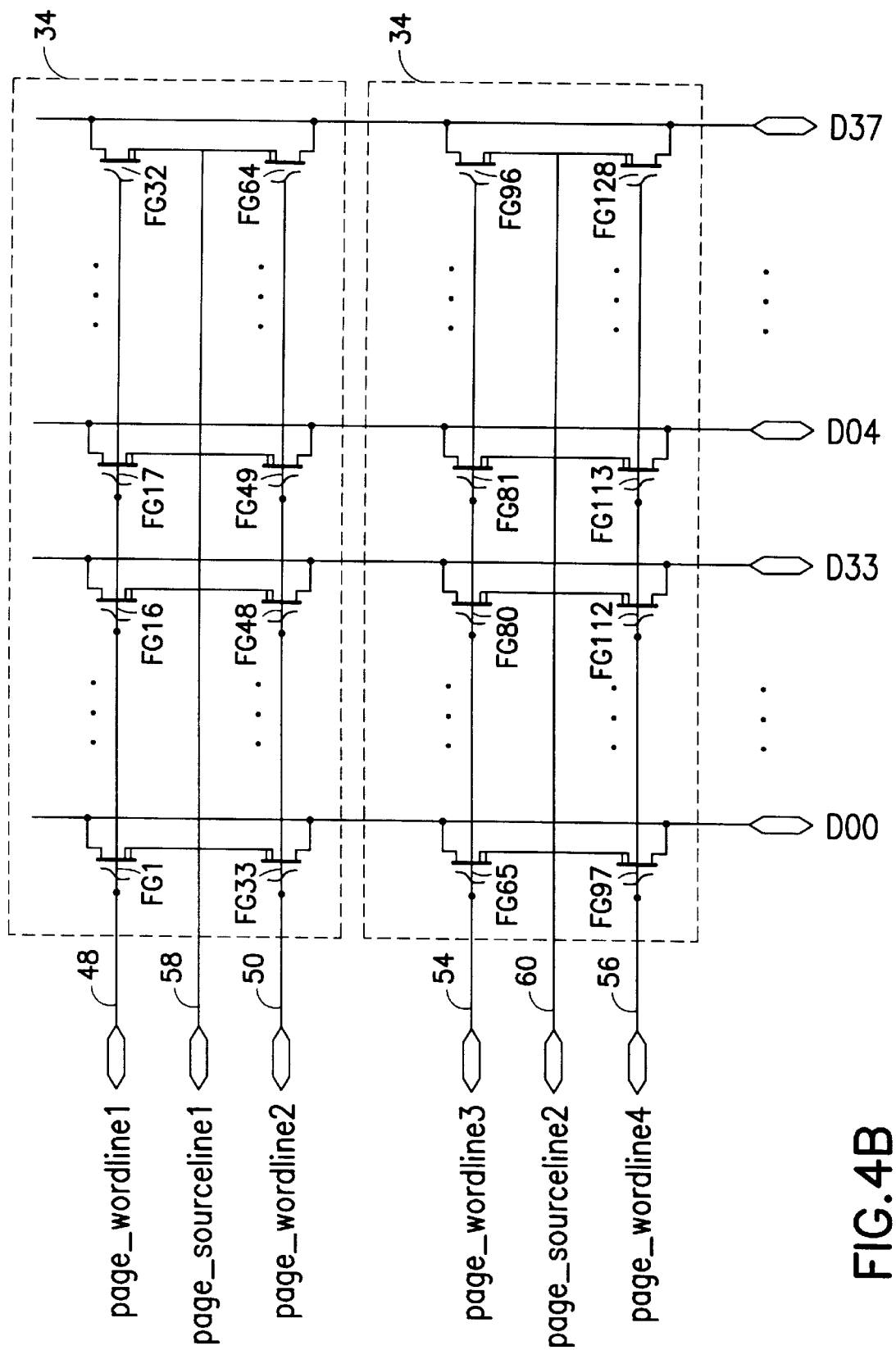
FIG. 4B shows a schematic diagram of subarray (32) of FIG. 3

FIG. 4B is a detailed schematic of one embodiment of a subarray (32). In the subarray (32) comprised of page 1 and page2, memory cell transistors FG1–FG64 correspond to page1 and memory cell transistors FG65–FG128 correspond to page2. In page1, FG1–FG32 share the same page-word line 48, FG33–FG64 share the same page-word line 50, and FG1–FG64 share the same page-source line 58. Similarly in page 2, FG65–FG128 share page-word lines 54 and 56 and page-source line 60.

During an erase operation, a pair of word lines (42) that couples (via the page-word lines) on to the gates of the memory cell transistors is taken to about 15V while the corresponding source line (44) (coupled via the page-source line) and/or bit lines (38) are held at 0V. The large voltage differential in the cell causes erasure, as subsequently detailed. Pages that are not to be erased are unselected by applying 0V to the control-circuit-row line (36) or applying 0V to the pair of page-word lines.

Erase is followed by a program operation. Each byte in the erased page is programmed by applying 12V to the page-source line, applying a voltage about equal to a Vt to the page-word line and by applying either 0V or 3V to the bitline. The high voltage on the page-source line is present while all bytes are being programmed, but, due to the relatively small number of bytes in the page, the period of time in which unprogrammed or erased bits are exposed to the disturb is quite short. Thus, the charge gain on the floating gates that results from this disturb action is negligible. In addition, the page-source line node which is common to all cells in a page is isolated from all other pages in the array and therefore there are no disturb actions between different pages. Unselected pages have 0V applied to the page-source line and are therefore not exposed to any high voltages.

Read is preformed by applying about 2V to the selected page-word lines, 0V to the page-source lines and about 1.2V to the selected bit lines. The written state of the cells is determined by examining the drain current flowing through the bit lines—a current flow equal to several tens of microamps flows in an erased cell (logic 1); the current in a programmed cell is lower by several orders of magnitude. The cells within a group of two pages 34 are unselected by applying 0V to the corresponding page-word lines. Bit lines D00 to D32 (digitally designated) correspond to bit lines 1–32 and are applied to the drains of FG1–FG128. For example bit line D00 is applied to FG1, FG33, FG65, and FG97.

The examples contained within are illustrative and several variations are possible within the scope of the invention. The number of cells within a page 34, the number of pages 34 that correspond to a control circuit 40 and the number of pages 34 with an array 30 can be modified according to the features required in the application. Endurance, average write time per cell, compactness, ease of interfacing and control are all features that can be adjusted by varying the above parameters. Increasing the number of cells within a page can reduce the average write time per cell because the single, more lengthy erase operation is shared between more cells. This is advantageous for systems in which large blocks of data are being written simultaneously and can also result in more compact physical layout. However, this is at the cost of reduced endurance for applications that change small amounts of data at any one time. An increased number of pages 34 per control circuit 40 and an increased number of cells per page 34 can increase the physical dimensions in the vertical and horizontal directions respectively. Since the memory cell array consists of an array of single transistors, usually with minimum feature sizes, the additional physical space at the periphery of the array is advantageous. Such space facilitates the placement of circuits which generate the word lines 42, source lines 44 and control-circuit-row lines 36. Thus the architecture can be modified in order to achieve the desired trade off between endurance, page write time, average write time per cell, data organization, ease of interfacing and physical compactness.

FIGS. 4A and 4B show the inventive array using SST SuperFlash Technology. However, other flash technologies could be used. The SST SuperFlash Technology is described in the publicly available Silicon Storage Inc. Flash Memory 1998 Data Book, pp. 6–42. The text of these pages with the figures renumbered is as follows.

1.0 Introduction

The following paper describes the patented and proprietary Silicon Storage Technology, Inc. (SST) CMOS Super-Flash EEPROM technology and the SST field enhancing tunneling injector split-gate memory cell. The SuperFlash technology and memory cell have a number of important advantages for designing and manufacturing flash EEPROMs or embedding SuperFlash memory in logic devices, when compared with the thin oxide stacked gate or two transistor approaches. These advantages translate into significant cost and reliability benefits for the user.

The SST SuperFlash technology typically uses a simpler process with fewer masking layers, compared to other flash EEPROM approaches. The fewer masking steps significantly reduce the cost of manufacturing a wafer. Reliability is improved by reducing the latent defect density, i.e. fewer layers are exposed to possible defect causing mechanisms.

The SST split gate memory cell is comparable in size to the single transistor stacked gate cell (for a given level of technology), yet provides the performance and reliability benefits of the traditional two transistor byte alterable E$^2$PROM cell. By design, the SST split gate memory cell eliminates the stacked gate issue of "overerase" by isolating each memory cell from the bit line. "Erase disturb" cannot occur because all bytes are simultaneously erased in the same page and each page is completely isolated from every other page during any high voltage operation.

2.0 Field Enhancing Tunneling Injector EEPROM Cell

The field enhancing tunneling injector EEPROM cell is a single transistor split gate memory cell using poly-to-poly Fowler-Nordheim tunneling for erasing and source side channel hot electron injection for programming. Poly-to-poly tunneling is from a field enhancing tunneling injector formed on the floating gate using industry standard oxidation and dry etching techniques. Source side channel hot electron injection is very efficient, thus allowing the use of a small on-chip charge pump from a single low voltage power supply e.g., 5 or 3 volts. Cells are normally erased prior to programming.

The split gate memory cell size is comparable to traditional stacked gate memory cells using the same process technology. This is possible because;

a) the Tunneling injector cell does not need the extra spacing to isolate the higher voltages and currents required for programming the stacked gate. Array, and b) floating gate extensions are not needed to achieve the required stacked gate coupling ratios.

Additionally, the simplicity of the structure eliminates many of the peripheral logic functions needed to control erasing of the stacked gate device. The tunneling injector cell can be formed using standard CMOS processes. Memory arrays may use either random access or sequential access peripheral architectures.

3.0 Cell Structure 3.1 Cell Cross Sections and Layout

Figure 5A:
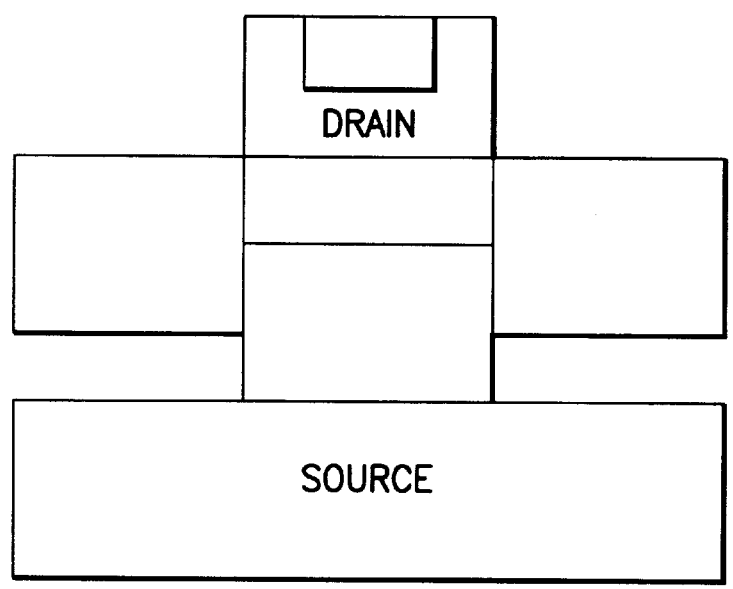
FIG. 5A is a top view of a FLASH EPROM cell.
Figure 5B:
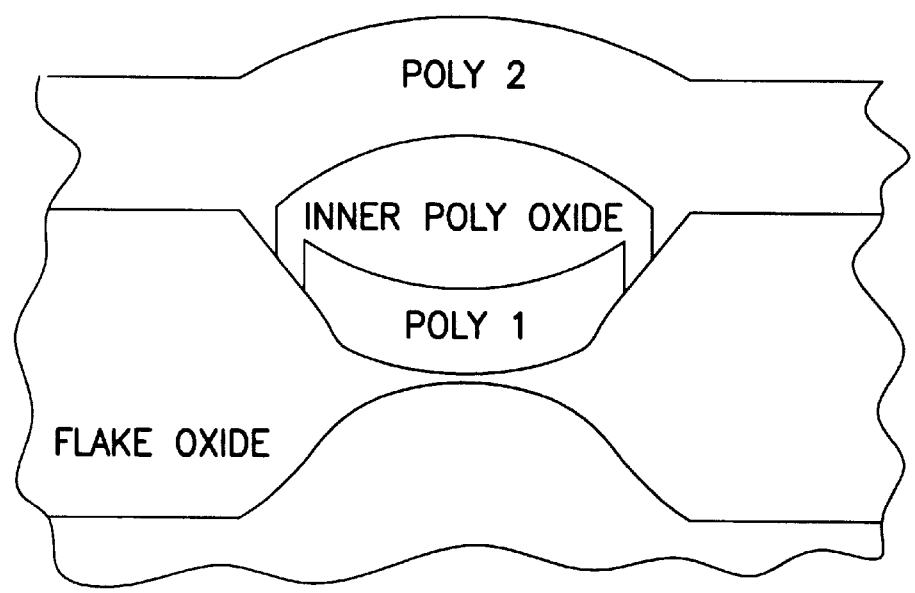
FIG. 5B is a cross-section view of a FLASH EPROM cell along a WORD line.

A top view and a cross-sectional view along the word line are presented in FIGS. 5A and 5B (note drawings are not to scale).

Figure 6A:
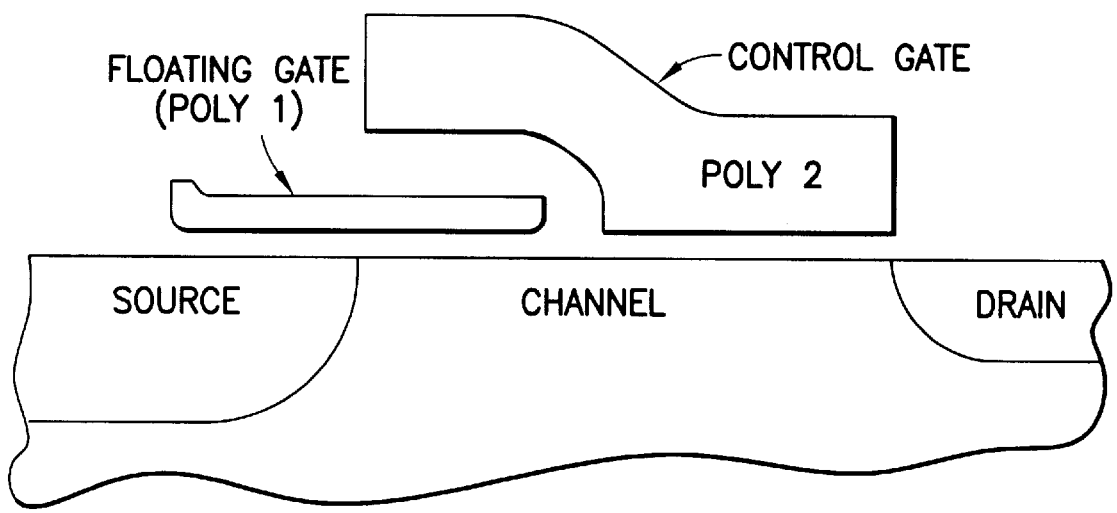
FIG. 6A is a cross-section view of a FLASH EPROM cell along a BIT line.
Figure 6B:
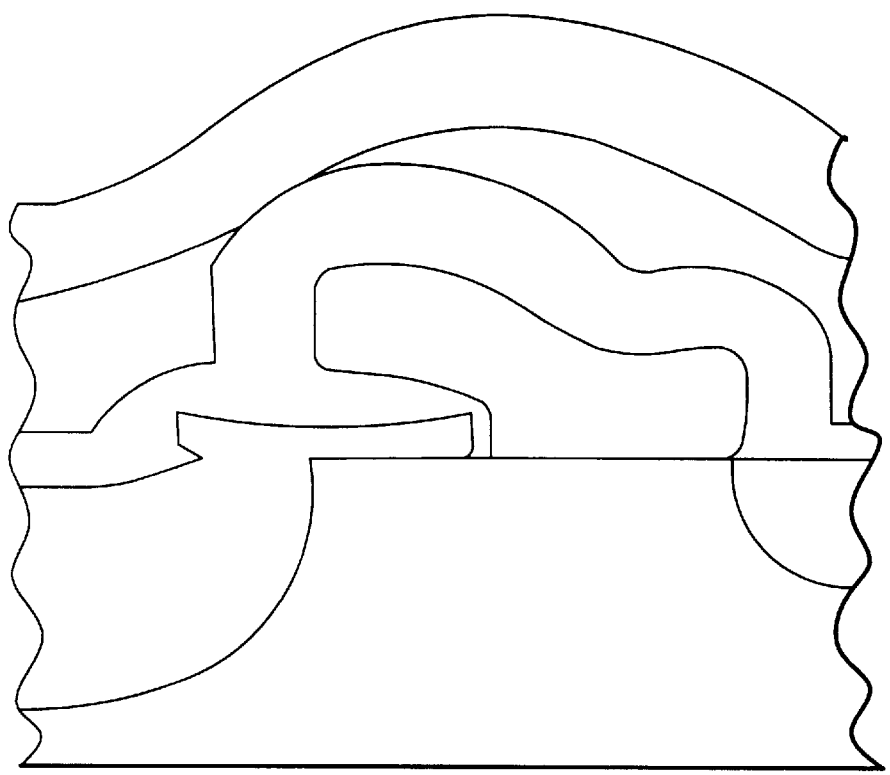
FIG. 6B is a cross-section SEM picture of a FLASH EPROM cell.

A cross-sectional view along the bit line and an SEM cross-section are presented in FIGS. 6A and 6B. Polysilicon or polysilicon with silicide is used to connect control gates along the word line (row). Metal is used to connect the drain of each memory cell along the bit line (column). A common source is used for each page, i.e., each pair of bits sharing a common source along a row pair (even plus odd row). A single word line is referred to as a row; the combination of the even and odd rows form a page, which is erased as an entity. Programming may be either byte by byte individually or for all bytes within the same page simultaneously.

The drain region consists of an n+S/D diffusion, which is aligned with the edge at the Poly 2 control gate. The source region consists of an n+S/D diffusion, which overlaps the floating poly. A cell implant beneath the floating gate is used to control the intrinsic cell threshold ($V_T$) and the punch through voltage. The select gate is separated from the channel by a 40 nm oxide (note: all the values are for a generic 1 $\mu$ technology). The floating gate is separated from the channel and source diffusion by a thermally grown 15 nm gate oxide. The floating gate is separated from the control gate by a 40 nm oxide on the sidewall and a 200 nm oxide vertically between the gates. The tunneling injector on the floating gate is formed by oxidation of the polysilicon, similar to the formation of the field oxide "birds beak" on single crystal silicon, followed by a reactive ion etching of polysilicon. A silicide or polycide can be formed on the control gate to reduce the poly word line resistance.

3.2 Cell Array Schematic

Figure 7A:
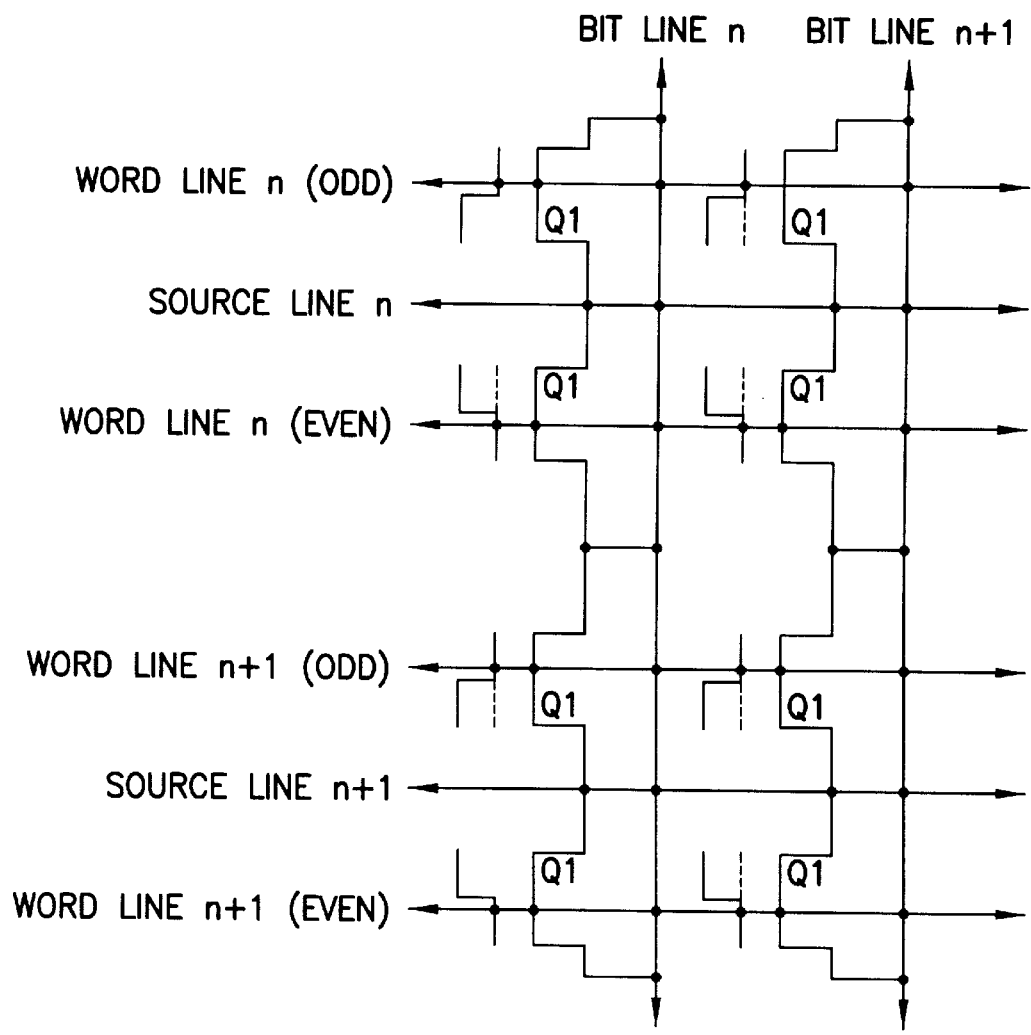
FIG. 7A is a FLASH cell array schematic.
Figure 8:
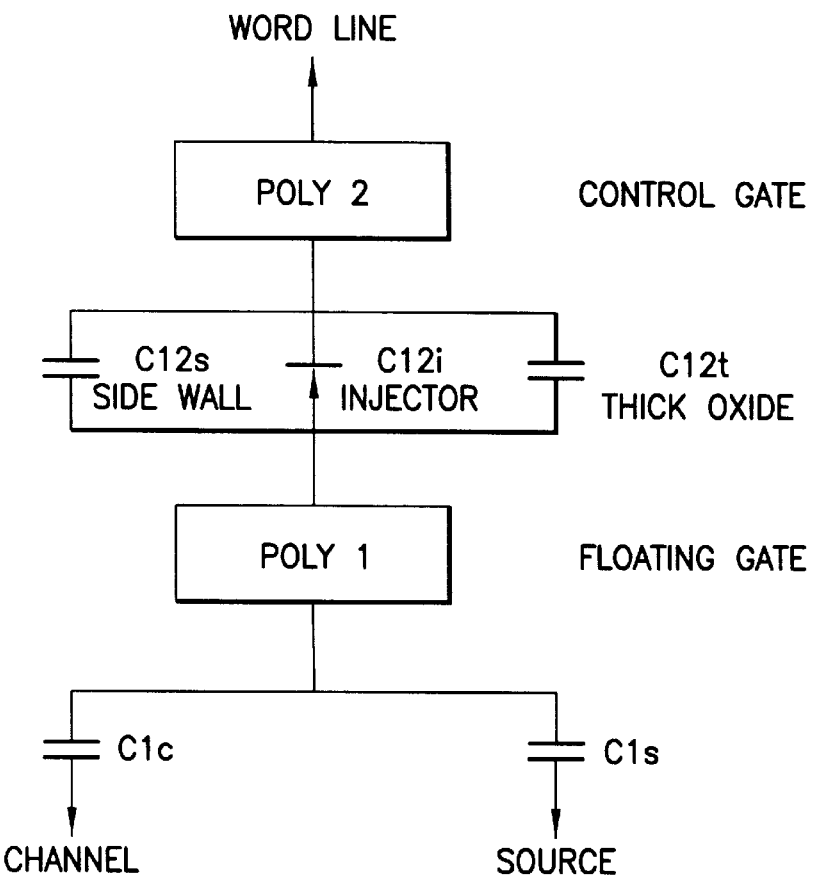
FIG. 8 is an equivalent capacitive coupling schematic.

The cell schematic is presented in FIG. 7A, showing the logical organization of the memory array. An equivalent circuit representation used to illustrate capacitive coupling is presented in FIG. 8.

For the split gate memory cell, the channel between the source and drain is split and controlled by the series combination of the select gate transistor and the memory gate transistor. The memory transistor is either in high or low negative threshold state depending on the amount of stored electric charge on the floating gate. See FIG. 7A.

During the read operation, this reference voltage is applied to the control gate and the select gate, via the word line. The reference voltage will "turn on" the select gate portion of the channel. If the floating gate is programmed (high threshold state), the memory transistor portion of the channel will not conduct. If the floating gate is erased (low or negative threshold state), this memory cell will conduct. The conducting state is output as logic "1", the non-conducting state is a logic "0".

Figure 7B:
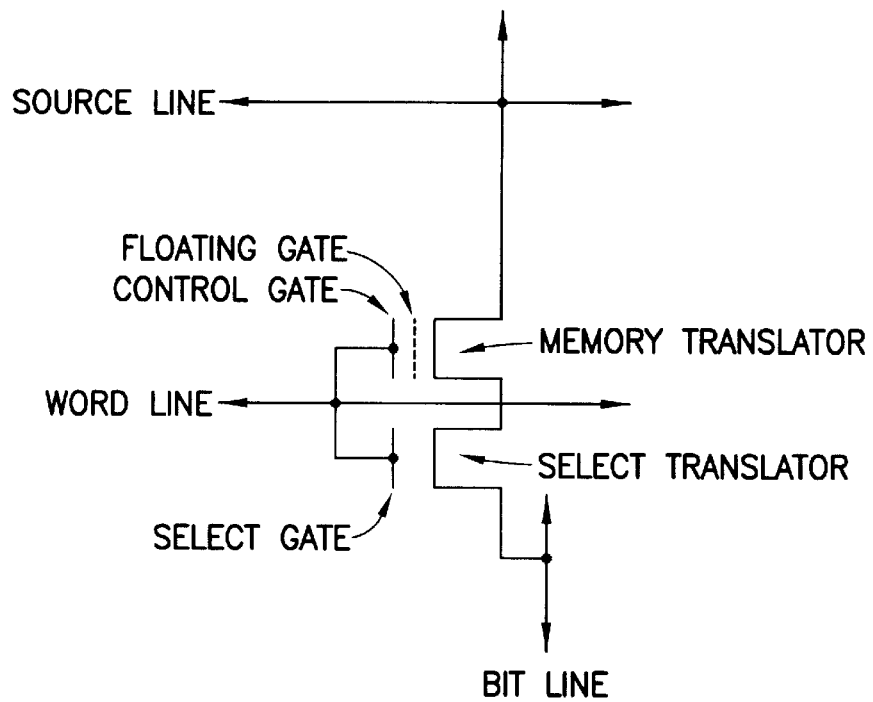
FIG. 7B is an equivalent single cell structure schematic.

FIG. 7A represents a section of a typical cross-point memory array, arranged as 8 memory cells in 2 columns (bit lines), 2 source lines, and 4 word lines (rows). Note, the word line is split into an even and odd row, which isolates the source line from all other source lines. FIG. 7B is an equivalent memory cell, showing how the split gate cell provides the logical equivalent of a select transistor and a memory transistor. The voltage applied to each terminal during normal operations is listed in Table 1.

C1O=C1c+C1s; C12=C12s+C12I+C12t

Coupling Ratios (CR) are defined as:

1. $CR1O = CR$ (poly 1 to substrate)
   $= C1O/(C1O + C12)$

2. $CR12 = CR$ (poly 1 to poly 2)
   $= C12/(C1O + C12)$

3. CR10+CR12=1

During erasing, the channel is in inversion due to the word line voltage. This increases the value of C1c. During programming the channel is in depletion; thus, C1c is negligible. Therefore, the coupling ratios are different during erasing and programming.

During programming, the coupling capacitance ratio between the source and the floating gate is =80%. This means =80% of the voltage at the source will be coupled to the floating gate, e.g., if the source is at 12 volts, the floating gate will be at 9.6 volts, given no charge on the floating gate.

The following Table 1 gives the conditions for the memory cell terminals during the erase, program, and read operations. These are nominal conditions for a generic 1 $\mu$ process. Vdd is the power supply, nominal 3 or 5 volts. Vss is ground. $V_T$ is the cell threshold. $V_{REF}$ is the reference voltage used to access the memory cell during the read cycle. The high voltages on the word line during erase and the source line during programming are generated by an on-chip charge pump.

TABLE 1

| Operating Conditions | | | |
| --- | --- | --- | --- |
| | ERASE | PROGRAM | READ |
| WORD LINE | = 15 volts | $V_T$ | $V_{REF}$ |
| BIT LINE | Vss | Vdd → "1" = Vss → "0" | = 2 volts |
| SOURCE LINE | Vss | = 12 volts | Vss |

4.0 Charge Transfer Mechanisms 4.1 Erasing

The cell erases using floating gate to control gate Fowler-Nordheim tunneling. The floating gate poly oxidation process provides a uniform field enhanced tunneling injector along the edges of the floating gate. This repeatable manufacturing process provides consistent oxide integrity that minimizes endurance induced degradation. i.e., charge trapping or oxide rupture.

During erasing, the source and drain are grounded and the word line is raised to =15 volts. The conditions for erasing are in Table 1, reference FIG. 6 for identification of terminals. The low coupling ratio between the control gate and the floating gate provides a significant $\Delta V$ across the interpoly oxide, which is the same everywhere between Poly 1 and Poly 2. A local high electric field is generated primarily along the edge of the tunneling injector. Charge transfer is very rapid and is eventually limited by the accumulation of positive charge on the floating gate. This positive charge raises the floating gate voltage until there is insufficient $\Delta V$ to sustain Fowler-Nordheim tunneling.

The removal of negative charge leaves a net positive charge on the floating gate. The positive charge on the floating gate decreases the memory cells threshold voltage, such that the memory cell will conduct ≅80 $\mu$A when the reference voltage is applied to the memory cell during a read cycle. The reference voltage is sufficient to turn on both the select transistor and the erased memory transistor in the addressed memory cell.

Erasing can either be by fixed erase pulses generated by an internal timer or algorithmically generated by an external controller in order to optimize erase performance.

4.2 Erase Disturb

The enhanced field tunneling injector devices are internally organized by pairs (pages) of even and odd rows. Each row pair (page) shares a common source line and each row pair has the word line at the same voltage potential during erasing. Thus, all bytes are simultaneously erased along the common word lines. All other word lines (pages) do not receive the erasing high voltage. Therefore, erase disturb is not possible. The column leakage phenomena caused by "overerase" in stacked gate cells is not possible, because the split gate provides an integral select gate to isolate each memory cell from the bit line.

4.3 Programming

The cell programs using high efficiency source-side channel hot electron injection. The conditions for programming are in Table 1, reference FIG. 6 for identification of terminals. The intrinsic (i.e. UV erased) floating gate threshold is positive; thus, the memory cell is essentially non-conducting, with the word line at the reference voltage during a read cycle.

During programming a voltage, approximately equaling the threshold $V_T$ of the select transistor is placed on the control gate, via the word line. This is sufficient to turn on the channel under the select portion of the control gate. The drain is at ≅Vss, if the cell is to be programmed. If the drain is at Vdd programming is inhibited. The drain voltage is transferred across the select channel because of the voltage on the control gate. The source is at ≅12 volts. The source to drain voltage differential (i.e. 12 volts-≅Vss) generates channel hot electrons. The source voltage is capacitively coupled to the floating gate. The field between the floating gate and the channel very efficiently (≅80%) sweeps to the floating gate those channel hot electrons that cross the Si—SIO$_2$ barrier height of ≅3.2 eV.

The programming effect is eventually self-limiting as negative charge accumulates on the floating gate. The programming source-drain current is very low; thus, the source voltage can be generated by a charge pump internal to the die. The program time is fast because of the high efficiency of source side injection. The addition of negative charge to the floating gate neutralizes the positive charge generated during erasing; thus, the cell is non-conducting when the reference voltage is applied during a read cycle.

Programming can either be by fixed program pulses generated by an internal timer or generated by an external controller to optimize program conditions.

4.4 Program Disturb

The memory cells are arranged in a true cross point array, using a word line and bit line for address location selection; thus, unselected cells within a page will see the programming voltages. There are two types of possible program disturbs with the field enhanced tunneling injection cell, both of which are described in the following paragraphs. Both mechanisms are preventable by proper design and processing. Defects are screenable with testing. Devices with this memory architecture do not have program disturb caused by accumulated erase/programming cycles because each page is individually isolated. Each cell is only exposed to high voltage within the selected page along the row or source line, there is no high voltage on the bit line.

4.4.1 Reverse Tunnel Disturb

Reverse tunnel disturb can occur for unselected erased cells within the page sharing a common source line, but on the other row of the selected page to be programmed thus, the word line is grounded. The source voltage is capacitively coupled to the floating gate of the unselected erased cell. If there is a defect in the oxide between the control gate and the floating gate, Fowler-Nordheim tunneling may occur. This could program the unselected erased cell. Proper design and processing assures the reverse tunnel voltage is significantly higher than any applied voltage. Defects are eliminated by including a reverse tunnel voltage screen in the 80% testing operations. Forward tunneling is defined as occurring when electrons are transferred from poly 1 (the floating gate) to poly 2 (the control gate), thereby erasing the cell. Reverse tunneling is defined as occurring when electrons are transferred from poly 2 to poly 1, thereby programming the cell.

4.4.2 Punch through Disturb

Within a page, punch through disturb can occur for erased cells in the adjacent inhibited word line, that share a common source line and bit line with the cell being programmed. An inhibited word line is grounded to prevent normal channel hot electron injection. If there is a defect that reduces channel length and creates punch through along the select gate channel, there could be hot electrons available to program the inhibited erased cell. Proper design and processing assures the punch through voltage is significantly higher than any applied voltage. Defects are eliminated by including a punch through voltage screen in the 80% testing operation.

5.0 Other Reliability Considerations

5.1 Oxide Integrity

All oxides are subject to time dependent dielectric breakdown (TDDB), i.e., for a given oxide and electric field, eventually the oxide will breakdown. The lower the electric field and the less time the field is applied, the longer the time to breakdown. For oxides used in normal TTL voltage circuits, this time is essentially infinite; however, in flash memories that use high voltages, the time of oxide exposure to high electric fields can contribute to the intrinsic device reliability.

SST memory cell uses an $\cong 4$ MV/cm electric field during erasing. This value is significantly lower than the $\cong 10$ MV/cm used by stacked gate flash approaches or the $\cong 11$ MV/cm used by the thin oxide E$^2$PROM and NAND flash approaches. Since the oxide time dependent breakdown ratio is an exponential function of the field strength, the SST memory cell intrinsically has a much lower failure rate than stacked gate cell for oxide breakdown. Note, the SST cal is exposed to the lower electric field for significantly less time during erase, compared with stacked gate approaches.

5.2 Contact Integrity

All memory arrays contain metal to silicon contacts, typically from the metal bit line to the diffused drain of the memory cell. Stacked gate and the SST memory cells use a standard cross-point array, whereby a contact is shared by every two memory cells; thus, there are many contacts in a large memory array, e.g., a 4 Megabit chip contains over 2,000,000 contacts. Contacts must have a very low failure rate because there are so many of them. Contacts and associated metal lines are subject to failure based on the current density passing through the contact and metal line. The lower the current density, the lower the potential failure rate due to contact damage or electromigration mechanisms.

The source-side channel hot electron injection current used in programming SST cells is significantly lower than the drain-side channel hot electron injection current used in programming stacked gate cells. During programming, SST cells use less than 1 $\mu$A of source/drain current: this is much less than the read cell current. In contrast, a stacked gate cell requires 500 to 1,000 $\mu$A of source-drain current during programming; which is much higher than the read cell current. The high programming current density in stacked gate cells results in a higher probability of failure due to contact damage or electromigration. Since the programming current for the SST cell is much lower than the read current, there is no increase in the reliability failure rate due to programming induced current density failure mechanisms.

Fowler-Nordheim tunneling used for erase is intrinsically a low current operation. Therefore, both the SST and stacked gate cells are not measurably affected by current density during the erase operation.

5.3 Data Retention

The field enhancing tunneling injector cell uses relatively thick oxides, compared with other E$^2$PROM or flash EEPROM cells; therefore, intrinsic data retention is robust. The thicker oxides minimize initial and latent oxide defects; thus, improving yield and oxide integrity. The lower voltages used for erase and programming combined with the relatively thicker oxides reduce the endurance related extrinsic data retention failure rate.

5.4 Endurance

Since the field enhancing tunneling injector cell uses a relatively thick oxide for the Fowler-Nordheim tunneling transfer oxide, the primary endurance limitation is due to charge trapping in the interpoly oxide. Since both erasing by tunneling and the source-side channel hot electron programming utilize relatively weaker electric fields across the poly 1 insulating oxides, the oxide rupture failure rate is low.

Trapping occurs mainly in an $\cong 20$ Angstrom shallow region adjacent to the tunneling injector. Within this distance, direct tunneling de-trapping occurs in the quiescent times between erase/program cycles. In practice, this means the endurance of the device in real world applications will be greater than the endurance demonstrated in a test environment, where the device is being erase/program cycled at the maximum possible frequency.

5.5 Disturbs

A major concern of reprogrammable nonvolatile memories is that of "disturb" phenomena, i.e., where a different location than the one being erased or programmed is altered. "Disturbs" can occur whenever a high voltage is applied to the gate, source, or drain of a memory cell that is not being intentionally erased or programmed. The SST cell has several design advantages to reduce the possibilities for a disturb:

a). There is no high voltage placed on the bit line, as is common for stacked gate approaches. In addition, the split gate cell isolates each memory storage node from all other nodes along the bit line. Thus, a disturb via the bit line (connected to the drain) is not possible.

b) The device uses a page erase, whereby all bytes in the page are erased simultaneously, i.e., see the same high voltage at the same time. Since each page is isolated from every other page by the word line selection circuitry, disturbs along the word line (connected to the gate) during erasing are not possible.

c) The device uses a unique source line for each page, unlike most stacked gate devices that have the source line common to large sectors or the entire array. This limits exposure to disturb conditions to only the cells within a page during the time that page is being programmed. This greatly reduces the probability of a disturb and eases the detection. i.e. only the page being programmed need be verified after any programming operation.

5.6 Life Test (Dynamic Burn-In)

The field enhancing tunneling injector cell uses standard CMOS technology in both the periphery and memory array; therefore, the life test results will be comparable to other devices built with the same process technology. As with all floating gate reprogrammable nonvolatile memories, life test results for a given technology will generally be better than other memories, e.g., SRAM's, built with the same technology because of the standard endurance and data retention infant mortality screening.

Figure 9:
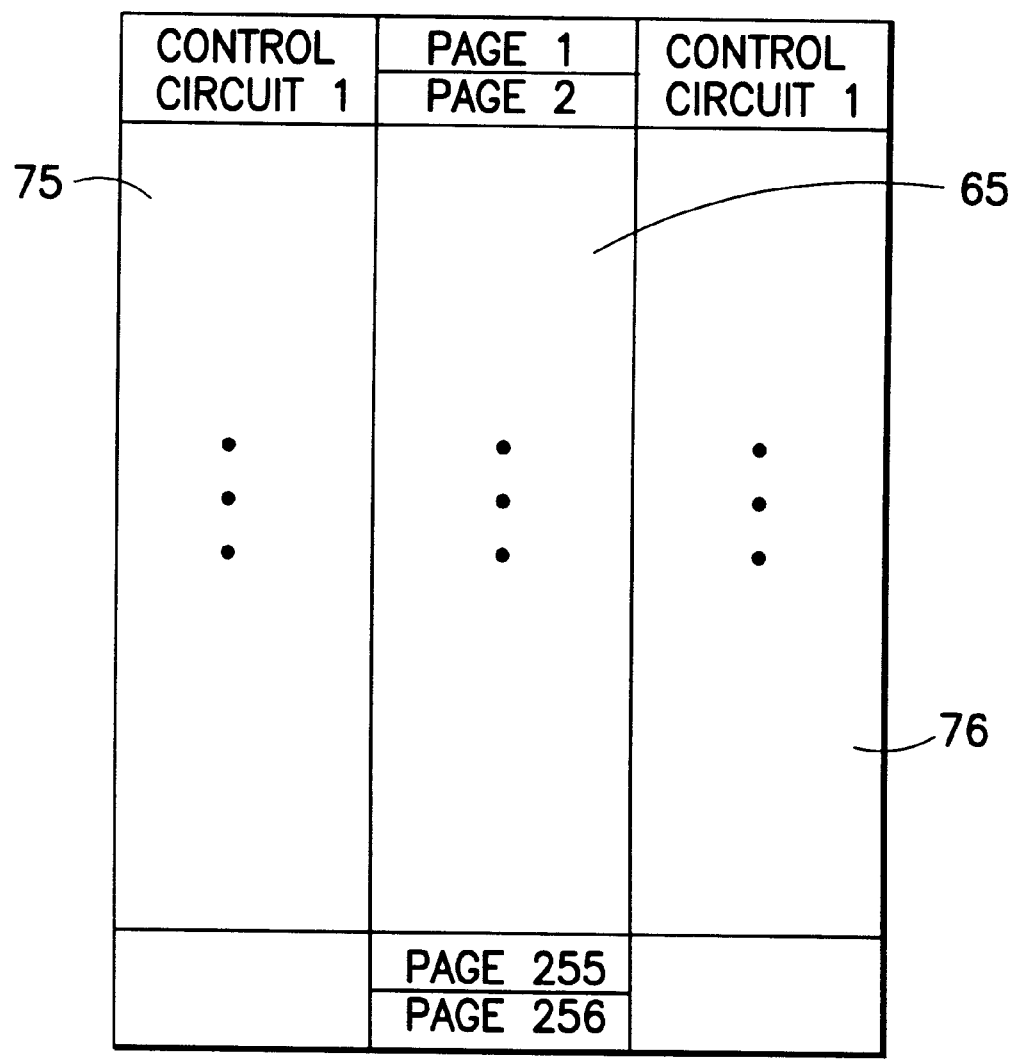
FIG. 9 is the geometrical layout plan of one embodiment.

Referring to FIG. 9, there is shown a topological plan view of the physical layout of one column 65 of the array 30 of memory pages and its two corresponding columns 75 and 76 of control circuits 40 and electrical coupling for one embodiment of the invention illustrated by FIGS. 3,and 4. Columns 75 and 76 are spaced apart and contain electrical coupling for the memory cells to form the pages 34 and the corresponding control circuits 40 for the pages 34. Column 65 contains one column of the non-volatile floating gate memory pages of array 30 and is dispersed between columns 75 and 76. FIG. 9 illustrates the physical layout of one column of array 30 of memory pages aligning the control circuits 40 and said electrical coupling of columns 75 and 76 with the corresponding one or more pages 34 of that column 65. As one of skill in the art would recognize, the number of columns 65, 75, and 76 required for a given array 30 will depend on the overall memory size requirements and maximum die size restraints.

Additionally to the EEPROM described above, when this flash technology is used on the same die to replace the mask ROM for code storage an additional benefit is that the replacement of mask ROM by flash EEPROM allows full testing of the code storage area as well as allowing customers to use that space for testing in their manufacturing procedures. The code used for testing can then be cleared and reprogrammed with the final code storage before final shipment.

These described benefits are achieved by implementing the code storage array as a more traditional flash array as described previously and allowing a mode of operation whereby the customer can erase a large amount or the entire block of code storage in a short amount of time. This "mass erase" operation is commonly used in the industry for internal test purposes but not commonly released to end customer usage. In this embodiment we have implemented this function using the SST SuperFlash Technology by driving all word lines of a cell array similar to that of FIG. 7A to a high voltage causing a simultaneous erase of all cells in the array. This function allows significant flexibility and/or space savings to the customers who use the mass erase feature during their manufacturing phase.

While the preferred embodiments of the invention have been shown and described, numerous variations and alternative embodiments will occur to those skilled in the art. Accordingly, it is intended that the invention be limited only in terms of the appended claims.

We claim:

1. A method for implementing reduced-page-size erasing and programming on a FLASH EEPROM for embedded microprocessors used on smart card applications, said method comprising the steps of:

electrically coupling a plurality of FLASH EEPROM cells to form a plurality of pages, wherein each of said pages comprises not more than about 1024 FLASH EEPROM cells;

providing a plurality of control circuits for selectively coupling control signals to said pages; and performing erase and program operations on at least a portion of said FLASH EEPROM cells of said pages having control signals selectively coupled thereto by said control circuits.

2. The method of claim 1, wherein each of said pages comprises not more than about 512 FLASH EEPROM cells.

3. The method of claim 1, wherein each of said pages comprises about 64 FLASH EEPROM cells.

4. A FLASH EEPROM capable of reduced-page-size erase and program operations, comprising:

a plurality of pages, each of said pages comprising one or more FLASH EEPROM cells electrically coupled together;

a plurality of control circuits, wherein each of said control circuits corresponds to one or more pages for selectively coupling signals to said one or more pages; and a plurality of control signals corresponding to said plurality of control circuits, wherein said control signals enable said selective coupling by said control circuits to said pages, wherein both said erase and program operations of said FLASH EEPROM can be performed on at least a portion of said FLASH EEPROM cells of said pages having said signals selectively coupled by corresponding control circuits.

5. A method for implementing reduced-page-size erasing and programming on a FLASH EEPROM for embedded microprocessors used on smart card applications, said method comprising the steps of:

forming a plurality of pages, each of which comprises one or more FLASH EEPROM cells electrically coupled together;

providing a plurality of control circuits, wherein each of said control circuits corresponds to one or more pages for selectively coupling signals to said one or more pages; and providing a plurality of control signals corresponding to said plurality of control circuits, wherein said control signals enable said selective coupling by said control circuits to said pages, wherein both erasing and programming can be performed on at least a portion of said FLASH EEPROM cells of said pages having said signals selectively coupled by corresponding control circuits.

6. A method for implementing reduced-page-size erasing and programming on an array of non-volatile floating gate memory cells for embedded microprocessors used on smart card applications, said method comprising the steps of:

forming a plurality of pages, each of which comprises one or more non-volatile floating gate memory cells;

providing a plurality of control circuits, wherein each of said control circuits corresponds to one or more pages for selectively coupling signals to said one or more pages; and providing a plurality of control signals corresponding to said plurality of said control circuits, wherein said control signals enable said selective coupling by said control circuits to said pages, wherein both erasing and programming can be performed on at least a portion of said non-volatile floating gate memory cells of said pages having said signals selectively coupled by corresponding control circuits.

7. The method of claim 6, wherein said array of non-volatile floating gate memory cells comprise FLASH EEPROM.

8. A method for implementing reduced-page-size erasing and programming on an array of non-volatile floating gate memory cells for embedded microprocessors used on smart card applications, said method comprising the steps of:
  providing a plurality of pages, each of which comprises one or more non-volatile floating gate memory cells electrically coupled together;
  providing a plurality of control circuits corresponding to said plurality of pages, for selectively coupling signals to said pages; and
  providing a plurality of control signals corresponding to said plurality of said control circuits, wherein said control signals enable said selective coupling by said control circuits to said pages,
wherein said array of non-volatile floating gate memory cells are arranged in a plurality of rows and columns, a plurality of said cells being electrically coupled to form a plurality of pages, each said page comprising one or more said cells, and wherein each of said non-volatile floating gate memory cells comprises a first region, a spaced apart second region, a channel region between said first and second regions, a floating gate, and a control gate, said array comprising:
  a plurality of page-word lines, each said page-word line connects to said control gate of one or more of said memory cells in one of said pages;
  a plurality of page-source lines, each said page-source line connects to said second region of all of said memory cells in one of said pages;
  a plurality of bit lines, each said bit line connects to said first region of all of said memory cells in one of said memory-cell-columns;
  a plurality of control circuits arranged in rows and columns, each said control circuit selectively couples signals to said page-word lines and said page-source lines of said pages;
  a plurality of control-circuit-row lines, each said control-circuit-row line connects to all of said control circuits in a control-circuit-row, each said control-circuit-row line enables said selective coupling in all of said control circuits in said control-circuit-row;
  a plurality of word lines, one or more of said word lines connect to all of said control circuits in each of said control-circuit-columns, said plurality of word lines are selectively coupled to said page-word lines by said control circuits;
  a plurality of source lines, one or more of said source lines connect to all of said control circuits in each of said control-circuit-columns, said plurality of source lines are selectively coupled to said plurality of page-source lines by said control circuits.

9. The method of claim 8, wherein each of said plurality of control circuits comprise:
  a transistor circuit adapted to couple said source lines and said word lines to said page-source lines and said page-word lines dependant on the voltage level of said control-circuit-row line.

10. The method of claim 8, wherein the physical layout of said array comprises:
  a first column and a spaced apart second column, said first and second columns having said electrical coupling for said memory cells to form said plurality of pages and said control circuitry for said plurality of pages;
  a third column of non-volatile floating gate memory cells between said first and second columns.

11. The method of claim 10, wherein the physical layout of said array further comprises aligning said control circuitry and said electrical coupling of said first and second columns with the corresponding one or more of said plurality of pages of said third column of memory cells.

12. The method of Claim 8, wherein each of said memory cells are of the type having a first region, a spaced apart second region, a channel region between said first and second regions, a floating gate disposed over at least a portion of said channel region and insulated from said channel region, a control gate disposed over at least a portion of said floating gate and over any portion of said channel region that said floating gate is not disposed over, said control gate insulated from said channel region and said floating gate, said floating gate and/or said control gate disposed over and insulated from a portion of said first region and a portion of said second region.

13. The method of claim 12, wherein each of said memory cells are of the type where said floating gate is disposed over and insulated from a portion of said channel region and a portion of said second region and said control gate is disposed over and insulated from said floating gate and portion of said channel region that said floating gate is not disposed over, said control gate is disposed over and insulated from a portion of said first region.

14. An array of non-volatile floating gate memory cells capable of reduced-page-size erase and program operations, comprising:
  a plurality of pages, each of said pages comprising one or more non-volatile floating gate memory cells electrically coupled together;
  a plurality of control circuits, each corresponding to one or more pages for selectively coupling signals to said one or more pages; and
  a plurality of control signals corresponding to said plurality of control circuits, wherein said control signals enable said selective coupling by said control circuits to said pages,
wherein both said erase and program operations of said array of non-volatile floating gate memory cells can be performed on at least a portion of said non-volatile floating gate memory cells of said pages having said signals selectively coupled by corresponding control circuits.

15. An array of non-volatile floating gate memory cells capable of reduced-page-size erase and program operations, arranged in a plurality of rows and columns, wherein one or more of said cells are electrically coupled together to form a plurality of pages, wherein each of said cells comprises a first region, a spaced apart second region, a channel region between said first and second regions, a floating gate, and a control gate, said array comprising:
  a plurality of page-word lines, each connecting to said control gate of one or more memory cells in one page;
  a plurality of page-source lines, each connecting to said second region of all memory cells in one page;
  a plurality of bit lines, each connecting to said first region of all memory cells in one memory-cell-column; and
  a plurality of control circuits arranged in rows and columns, each selectively coupling control signals to one or more page-word lines and one or more page-source lines.

16. An embedded microprocessor for smart card applications comprising:

an array of ROM, said ROM adapted to store BIOS code;

a first array of non-volatile floating gate memory cells adapted to store program code, said first array of non-volatile floating gate memory cells implemented as OTPROM; and, a second array of non-volatile floating gate memory cells adapted to store data, said second array of non-volatile floating gate memory cells having reduced-page-size erase and program operations.

17. The embedded microprocessor for smart card applications of claim 16, wherein said second array of non-volatile floating gate memory cells comprises:

a plurality of pages, each of said pages having one or more array of non-volatile floating gate memory cells electrically coupled;

a plurality of control circuits corresponding to said pages, said control circuits selectively couple signals to said pages;

a plurality of control signals corresponding to said plurality of said control circuits, said control signals enable said selective coupling by said control circuits to said pages; and, wherein both said erase and program operations of said array of non-volatile floating gate memory cells can be performed on at least a portion of said array of non-volatile floating gate memory cells of said pages having said signals selectively coupled by said corresponding control circuits.

18. The embedded microprocessor of claim 16, wherein said first and/or second array of non-volatile floating gate memory cells comprise arrays of FLASH EEPROM cells.

19. A method for implementing reduced-page-size erasing and programming on an array of non-volatile floating gate memory cells for embedded microprocessors used on smart card applications, said method comprising the steps of:

electrically coupling a plurality of non-volatile floating gate memory cells to form a plurality of pages, wherein each of said pages comprises not more than about 1024 cells;

providing a plurality of control circuits for selectively coupling control signals to said pages; and performing erase and program operations on at least a portion of said non-volatile floating gate memory cells of said pages having control signals selectively coupled thereto by said control circuits.

20. The method of claim 19, wherein each of said pages comprises not more than about 512 cells.

21. The method of claim 19, wherein each of said pages comprises about 64 cells.

22. A method for erasing and programming on a FLASH EEPROM array for embedded microprocessors used on smart card applications, comprising the steps of:

providing a FLASH EEPROM array comprising a plurality of pages, wherein each page comprises multiple FLASH EEPROM cells electrically coupled together, and wherein total number of FLASH EEPROM cells on each page is not more than about 1024;

selecting one or more pages of FLASH EEPROM cells for erasing and programming;

reading said one or more pages into a register that is external to said FLASH EEPROM array;

registering byte information that is to be programmed with the external register;

erasing said one or more pages of FLASH EEPROM cells; and writing the registered byte information into said one or more pages of FLASH EEPROM cells from the external register.

23. The method of claim 22, wherein total number of FLASH EEPROM cells on each page is not more than about 512.

24. The method of claim 22, wherein total number of FLASH EEPROM cells on each page is about 64.

25. The method of claim 22, wherein the writing is conducted on a cell-by-cell basis.

26. The method of claim 22, wherein the writing is conducted on a byte-by-byte basis.

27. The method of claim 22, wherein the writing is conducted on a multiple-byte basis.

28. The method of claim 22, wherein the external register has a memory size that is no less than that of each said page.

29. A method for erasing and programming on an array of non-volatile floating gate memory cells for embedded microprocessors used on smart card applications, comprising the steps of:

providing an array of non-volatile floating gate memory cells arranged into a plurality of pages, wherein each page comprises multiple non-volatile floating gate memory cells electrically coupled together, and wherein total number of cells on each page is not more than about 1024;

selecting one or more pages of non-volatile floating gate memory cells for erasing and programming;

reading said one or more pages into a register that is external to said array;

registering byte information that is to be programmed with the external register;

erasing said one or more pages of non-volatile floating gate memory cells; and writing the registered byte information into said one or more pages of cells from the external register.

30. A method for implementing reduced-page-size erasing and programming on an array of non-volatile floating gate memory cells for embedded microprocessors used on smart card applications, said method comprising the steps of:

forming a plurality of pages, each of which comprises one or more non-volatile floating gate memory cells electrically coupled together;

providing a plurality of control circuits arranged in rows and columns for selectively coupling control signals to said pages through page-word lines and page-source lines; and providing a plurality of control signals corresponding to said plurality of control circuits, wherein said control signals enable said selective coupling by said control circuits to said pages, wherein both erasing and programming can be performed on at least a portion of said non-volatile floating gate memory cells of said pages having said control signals selectively coupled by corresponding control circuits.

31. The method of claim 30, wherein the array of non-volatile floating gate memory cells comprise FLASH EEPROM cells.

* * * * *